(12) United States Patent
Wang et al.

(10) Patent No.: US 7,257,893 B2
(45) Date of Patent: Aug. 21, 2007

(54) EFFICIENT WAFER PROCESSING TECHNOLOGY

(75) Inventors: Hung-Ming Wang, San Jose, CA (US); Bulent M. Basol, Manhattan Beach, CA (US); Homayoun Talieh, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/447,368

(22) Filed: Jun. 5, 2006

(65) Prior Publication Data

US 2007/0050974 A1   Mar. 8, 2007

Related U.S. Application Data

(60) Provisional application No. 60/687,190, filed on Jun. 3, 2005.

(51) Int. Cl.
*H01K 3/10* (2006.01)
(52) U.S. Cl. ............................ 29/852; 29/846; 205/222; 438/584; 438/637; 438/678; 438/687
(58) Field of Classification Search .................. 29/825, 29/846, 852; 205/222; 438/584, 637, 678, 438/687
See application file for complete search history.

(56) References Cited

U.S. PATENT DOCUMENTS

| 6,056,864 | A  * | 5/2000  | Cheung ....................... 205/222 |
| 6,315,883 | B1 * | 11/2001 | Mayer et al. ................ 205/123 |
| 6,709,979 | B2 * | 3/2004  | Komai et al. ................ 438/678 |
| 6,861,354 | B2 * | 3/2005  | Uzoh et al. .................. 438/643 |
| 6,867,136 | B2 * | 3/2005  | Basol et al. ................. 438/687 |
| 6,921,551 | B2 * | 7/2005  | Basol .......................... 427/97.1 |
| 6,943,112 | B2 * | 9/2005  | Basol et al. ................. 438/687 |
| 2003/0119311 | A1 * | 6/2003 | Basol et al. ................. 438/678 |
| 2004/0012090 | A1 * | 1/2004 | Basol et al. ................. 257/755 |
| 2004/0132381 | A1 * | 7/2004 | Basol et al. ................... 451/5 |
| 2005/0227483 | A1 * | 10/2005 | Basol et al. ................. 438/652 |
| 2006/0009033 | A1 * | 1/2006 | Basol et al. ................. 438/674 |
| 2006/0121725 | A1 * | 6/2006 | Basol et al. ................. 438/626 |

* cited by examiner

*Primary Examiner*—Carl J. Arbes
(74) *Attorney, Agent, or Firm*—Knobbe Martens Olson & Bear LLP

(57) ABSTRACT

Consistent excess conductive material is provided for plated conductors in integrated circuit metallization, regardless of the size and depth of trenches/vias into which the conductive material is deposited. Accordingly, subsequent processing (e.g., material removal) can be consistent and efficient for wafers with different feature sizes (particularly different depths), and for wafers at different metallization levels.

21 Claims, 2 Drawing Sheets

EFFICIENT WAFER PROCESSING TECHNOLOGY

CROSS-REFERENCE TO RELATED APPLICATIONS

This application claims the benefit of U.S. Provisional Application No. 60/687,190, filed Jun. 3, 2005. This application is also related to U.S. Pat. No. 6,176,992, issued Jan. 23, 2001 and to U.S. application Ser. No. 11/088,324, filed Mar. 23, 2005, the entire disclosures of which are hereby incorporated herein by reference.

FIELD

The present invention generally relates to semiconductor integrated circuit technology and, more particularly, to technologies employing planar metal layers on wafers.

BACKGROUND

Conventional semiconductor devices generally include a semiconductor substrate, usually a silicon substrate, and a plurality of sequentially formed dielectric layers and conductive paths or interconnects made of conductive materials. Interconnects are usually formed by filling a conductive material in trenches etched into the dielectric layers. In an integrated circuit, multiple levels of interconnect networks laterally extend with respect to the substrate surface. Interconnects formed in different layers can be electrically connected using vias or contacts.

The filling of a conductive material into features, such as vias or trenches, configured for contacts, elongated lines or contacts, can be carried out by electrodeposition, also known as plating or electrochemical deposition (ECD). In an electrodeposition or electroplating process, a conductive material, such as copper, is deposited over the substrate surface, including into such features. However, the substrate surface may include a plurality of features having different sizes. In existing deposition technologies, the features are typically overfilled with the conductive material to ensure that each feature, regardless of its width, is completely filled with the conductive material. This overfilling results in a non-planar excess conductive layer on the surface of the substrate, which includes steps or recesses over the large width features. After deposition of conductive material, a material removal technique is employed to planarize and remove the excess conductive material or overburden from the top surface, leaving conductive material only in the features or cavities. A chemical mechanical polishing (CMP) process is typically employed to remove the excess conductive material on the top surface of the substrate. Thickness of the excess layer is generally 1.2-1.5 times the depth of the large width features, which, as noted above, varies.

An interconnect network is made of many levels of metal layers formed on top of one another. Generally, initial metal layers, such as, for example, $M_1$, $M_2$, which form the bottom of the metal stack, have the features with the smaller depths. Upper metal layers, such as, for example, $M_3 \ldots M_{10}$, may include gradually increasing depths per layer, resulting in thicker excess conductive layers at higher levels, due to the deeper features (e.g., vias, trenches, etc.) at those higher levels.

FIGS. 1 and 2 illustrate two different metal layers or metallization levels of exemplary multilayer semiconductor structures. FIG. 1 shows a substrate 10a having a first copper layer 12a deposited on a surface 14a of the substrate 10a, filling the features, such as the illustrated small features 16a and large features 18a, formed in the surface. As shown, the first copper layer 12a includes an excess layer 20a, which is non-planar and should ultimately be planarized for subsequent processing. For example, if the depth $d_a$ of the features 16a, 18a is 0.5 micron (μm), the thickness $t_a$ of the excess layer 20a can be 0.75 micron (μm). FIG. 2 shows another substrate 10b, including a second copper layer 12b deposited on a surface 14b of the substrate 10b to fill the features, such as small features 16b and large features 18b, formed in the surface. The second copper layer 12b is a copper layer forming an upper metal layer of a multilayer semiconductor structure. While illustrated in FIG. 2 as being in a different wafer, the skilled artisan will understand that the structure of FIG. 2 can represent an upper metal level of a multilayer structure, such as the one shown in FIG. 1, or a metal layer of a different multilayer structure, in a different wafer or the same wafer, in a different batch or the same batch. As shown, the second copper layer 12b is non-planar and dishes, especially in the area over the wide feature 18b. The second copper layer 12b includes an excess layer 20b having a thickness $t_b$. The feature depth $d_b$ of the substrate 10b shown in FIG. 2 is larger than the feature depth $d_a$ of the substrate 10a shown in FIG. 1 ($d_b > d_a$) If the depth of the features $d_b$ is, for example, 2 microns (μm), the thickness $t_b$ of the excess layer 20b can be 3 microns (μm).

Chemical mechanical polishing (CMP) of these two substrates or wafers 10a, 10b using the same CMP system can be a complicated and costly process. Because of the thin excess layer 20a on the substrate 10a shown in FIG. 1, the substrate 10a will be planarized more quickly than the substrate 10b shown in FIG. 2 because $t_b > t_a$. The substrate 10b, shown in FIG. 2, with the thicker excess layer 20b will take a longer time to planarize. As such, in a process environment involving many wafers with different excess layer thicknesses, wafers with thicker excess layers will take more time and this would make it impractical to mix wafers with different feature depths in the same copper removal lot. Even in different lots, additional expense would be entailed in tailoring a single CMP machine to polish these different thicknesses. From a practical standpoint, the manufacturer will employ several different CMP tools to polish wafers having layers of different thicknesses, and will have to configure the CMP tools differently.

SUMMARY OF THE INVENTION

In accordance with one aspect of the invention, a method is provided for forming metal layers having substantially same thicknesses on wafers including features with varying depths. A first conductive layer is formed on a first wafer including a first top surface and a first feature having a first depth. Formation of the first conductive layer fills the first feature and the first conductive layer extends over the first top surface. A second conductive layer is deposited on a second wafer including a second top surface and a second feature having a second depth which is different than the first depth. Formation of the second conductive layer fills the second feature and the second conductive layer extends over the second top surface, wherein a thickness of the first layer over the first top surface is substantially the same as a thickness of the second layer over the second top surface. The first conductive layer may be removed from the first top surface and the second conductive layer may be removed from the second top surface in a chemical mechanical polishing station using substantially the same process conditions.

In accordance with another aspect of the invention, a method is provided for forming planar metal layers having substantially the same thickness on wafers including features with varying depths. A first conductive layer is deposited on a first wafer, which includes a first surface and a first feature having a first depth. Deposition of the first conductive layer fills the first feature and the first conductive layer extends over the first surface. A second conductive layer is deposited on a second wafer including a second surface and a second feature having a second depth which is different than the first depth. Deposition of the second conductive layer fills the second feature and the second conductive layer extends over the second surface. The first conductive layer and the second conductive layer are electropolished to form a first planar layer on the first surface and a second planar layer on the second surface. The thickness of the first planar layer on the first surface is substantially the same as the thickness of the second planar layer on the second surface. The first planar layer and the second planar layer are then removed using substantially the same process conditions.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

DETAILED DESCRIPTION OF THE PREFERRED EMBODIMENTS

Figure 1:
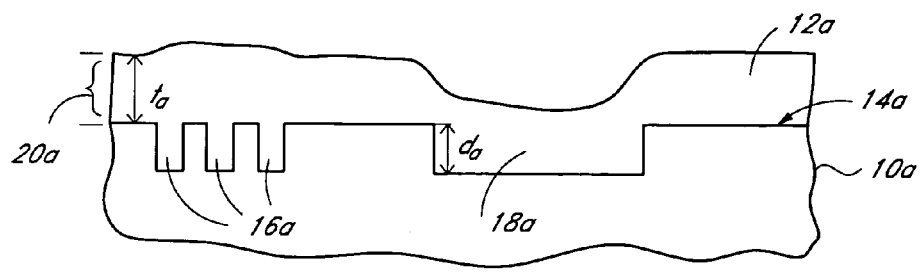
FIGS. 1 and 2 are schematic cross-sections of partially fabricated integrated circuits, illustrating different amounts of excess conductive material produced by conventional processing at different metallization levels.
Figure 2:
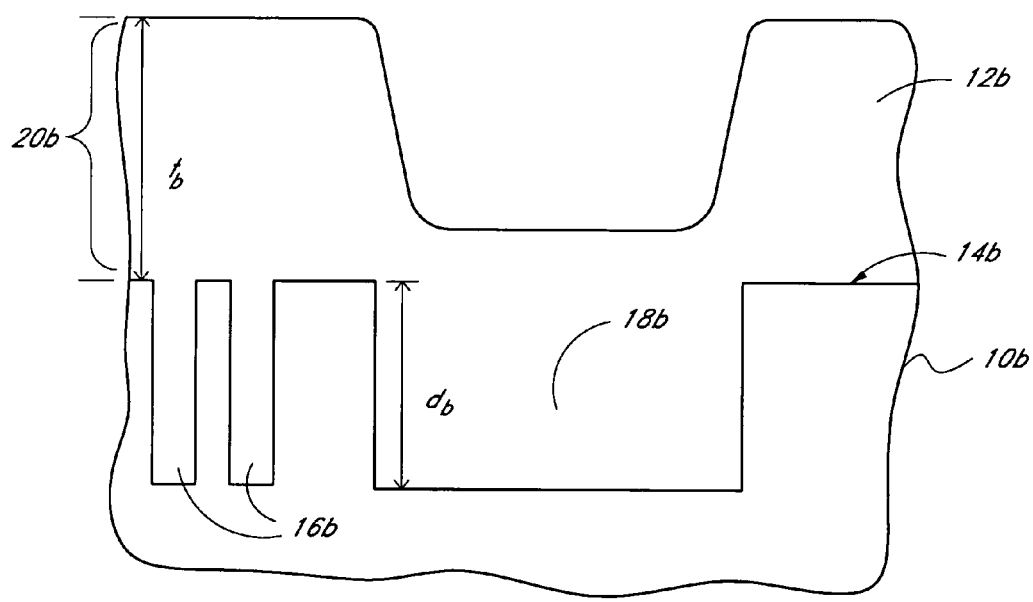

The following detailed description of the preferred embodiments and methods presents a description of certain specific embodiments to assist in understanding the claims. However, one may practice the present invention in a multitude of different embodiments and methods, as defined and covered by the claims.

As will be described below, the illustrated embodiments of the present invention provide methods and systems for forming wafers having planar excess layers for efficient material removal. In these embodiments, wafers having different metallization levels, such as $M_1$, $M_2$ ... $M_n$, may be processed to have planar metal layers having the same or substantially the same thickness. In this respect, each metallization level may include features including a specific depth that is different than the depth of features in another metallization level. Wafers including the planarized metal layers, having the same or substantially the same thickness, which are formed over different feature depths, are then planarized in the same or similar material removal systems, such as a chemical mechanical polishing system, using the same or similar conditions.

Delivery of a conductive layer with a consistent, predetermined thickness to a CMP process has many advantages. These advantages include better technical results, such as less dishing, erosion, and metal loss after CMP. These advantages become even stronger if a planar copper layer of pre-determined thickness is provided on all wafers, irrespective of the depth and size of the features or cavities formed on the wafer surface. In this case, a single CMP process or process recipe can be used for all types of wafers irrespective of the size and depth of the features and various interconnect metallization layers, such as $M_1$, $M_2$ ... $M_{10}$ etc. Accordingly, all of these metallization layers may be chemically mechanically polished, electrochemically mechanically polished, or electropolished using a single process recipe, in either a single CMP tool or in a series of similarly configured CMP tools. Various wafers with various feature or cavity depths may be processed at the same rate using this single recipe approach so long as the wafers all have the same or substantially the same pre-determined thickness of the conductive layer over the insulating top surface. Therefore, productivity improves since the conductive layer removal process step takes the same amount of time for all wafers, regardless of varying feature depths, and separately configured CMP tools are not needed for each stage. The embodiments described herein unify and greatly simplify the conductive layer removal process, such as a CMP process. The technical benefits mentioned above, such as smaller dishing and erosion, are also obtained by these embodiments.

In one embodiment, a process employs an electrochemical mechanical deposition (ECMD) process to form a planar copper layer having a predetermined thickness. It will be understood that, in this embodiment, copper is an exemplary conductive material and that alternative conductive materials may be substituted for copper. Electrochemical mechanical deposition (ECMD) for simultaneous plating and planarization is disclosed in U.S. Pat. No. 6,176,992, issued Jan. 23, 2001, and in U.S. Pat. No. 6,534,116, issued Mar. 18, 2003, the entire disclosures of which are hereby incorporated herein by reference.

Figure 3:
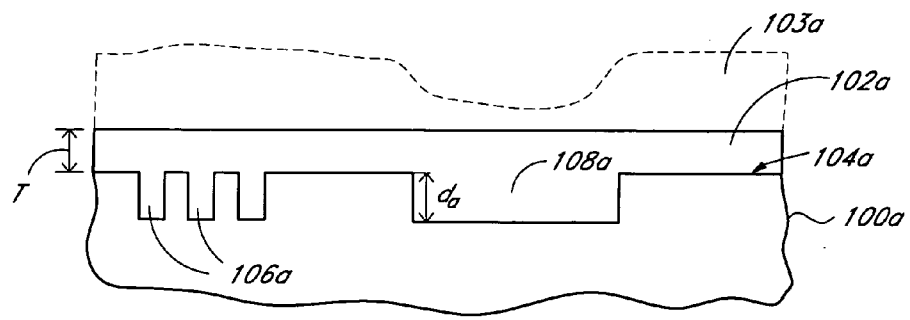
FIGS. 3 and 4 are schematic cross-sections of partially fabricated integrated circuits, illustrating consistent thicknesses of excess conductive material produced at different metallization levels (e.g., different levels having features of different depths), in accordance with a preferred embodiment.
Figure 4:
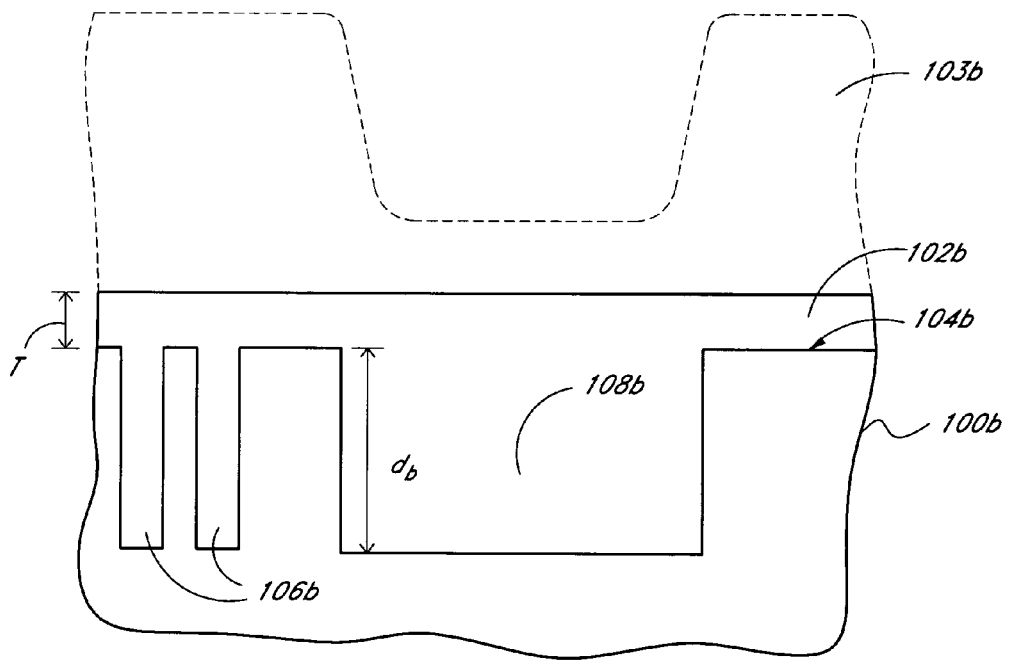

In this process, with reference to FIGS. 3 and 4, planar copper layers 102a and 102b are formed on the substrates 100a and 100b, respectively. The copper layer 102a may be an initial (lower level) copper layer on a wafer (having shallower features) and the copper layer 102b may be an upper level copper layer (having deeper features than those of the lower level) in a multi-layer semiconductor structure. It will be understood that the copper layer 102b may alternatively be an upper level copper layer over the copper layer 102a of the substrate 100a of FIG. 3.

The planar copper layer 102a is deposited on a surface 104a of the substrate 100a. According to this embodiment, an ECMD process is used to fill the features, such as small features 106a and large features 108a, formed in the surface. It will be appreciated that ECMD can optionally follow a first electrochemical deposition process (ECD) step. As shown in FIG. 4, the planar copper layer 102b is planar as deposited using ECMD on a surface 104b of the substrate 100b to fill the features, such as the illustrated small features 106b and large features 108b, formed in the surface.

ECMD of the layers 102a, 102b is preferably performed in one individual ECMD station or module, which may or may not be an integral part of a system that may include ECMD, CMP, ECD, ECMP (electrochemical mechanical polishing), cleaning and annealing stations. Alternatively, the ECMD of the substrates 100a and 100b can be performed in different ECMD stations. ECMD preferably employs a pad or belt to sweep the substrate surface during an electrodeposition process of a copper (or other conductive) layer. In ECMD, the simultaneous electrodeposition and sweeping by the pad or belt forms a planar copper surface, such as the surface of the layers 102a and 102b in the illustrated embodiments. The ECMD pad or belt may be a porous pad or belt including openings so that a deposition electrolyte can wet the surface of the substrate and an anode while the copper surface is swept by the pad or belt. Preferably, additives that encourage plating are swept away by the pad or belt from the upper surface of the conductive material, thereby inhibiting growth on high points while encouraging growth on low points. An ECD process deposits the copper (conductive material) directly onto the wafer without applying a pad to the copper surface; therefore, the deposited copper surface is non-planar. An ECD process can be performed in an ECD process station. Alternatively, the ECD process can also be performed in an ECMD station without the application of the pad to the wafer surface.

As shown in FIGS. 3 and 4, both layers 102a and 102b have the same predetermined thickness T at the end of the ECMD (whether alone or following ECD) process, although features 106b, 108b in the substrate 100b, shown in FIG. 4, are deeper than the features 106a, 108a in the substrate 100a, shown in FIG. 3 ($d_b>d_a$). The difference between depths $d_b$ and $d_a$ is preferably greater than 30%, and more preferably greater than 50% or more. For example, $d_a$ can be in a range of about 0.1-2 microns (more preferably about 0.3-0.6 microns) and $d_b$ can be in a range of 1-50 about microns (more preferably about 2-10 microns). The skilled artisan will appreciate that $d_b$ can be a through-wafer via, extending from the top surface of the wafer to the bottom surface. Preferably, the thicknesses T of the layers 102a, 102b are in a range between 0.2 µm and 0.8 µm, and more preferably in a range between 0.4 µm and 0.5 µm. Preferably, the variation in thickness T from wafer to wafer within a single process flow (e.g., at different metallization levels and for different wafers) is less than 0.2 µm, and more preferably less than about 0.1 µm. The skilled artisan will understand that the layers 102a and 102b are either formed on different substrates 100a, 100b having different feature depths $d_a$, $d_b$, or, alternatively, the layer 102b is formed as an upper layer over layer 102a on the same substrate.

In a preferred embodiment, once the planar layers 102a and 102b are obtained, the substrates are then planarized in the same or similarly configured material removal system, such as a chemical mechanical polishing (CMP) system, to remove the planar layers 102a and 102b from the surfaces 104a and 104b. Alternatively, the substrates may be planarized in different material removal systems (but similarly configured) using the same or substantially similar process recipe, such as a CMP recipe. The removal process is preferably performed using substantially the same recipe or process conditions, including, but not limited to slurry composition, pad pressure, process time, polishing pad type, pad, head speed, etc. It will be understood that separate CMP stations can be programmed and plumbed with similar configurations for substantially the same recipe to process wafers using the embodiments disclosed herein. The ability to configure multiple CMP stations similarly allows manufacturers to save on costs.

In another embodiment, at a first step, an electrochemical deposition process (ECD) is used to deposit non-planar copper layers; at a subsequent step of the process, these non-planar layers are electropolished down to a predetermined thickness, preferably using an electrochemical mechanical polishing (ECMP) process. Methods for processing wafers by ECD followed by ECMP are disclosed in U.S. patent application Ser. No. 11/088,324, filed Mar. 23, 2005, the entire disclosure of which is hereby incorporated herein by reference. For example, layers 102a and 102b of the substrates 100a and 100b shown in FIGS. 3 and 4 may be first deposited using an electrochemical deposition process. This deposition by ECD results in non-planar layers 103a and 103b, shown with dotted lines in FIGS. 3 and 4. Electropolishing of the non-planar layers 103a and 103b using ECMP will produce the planar layers 102a and 102b. The planar layers 102a and 102b are subsequently removed using a CMP process in a CMP station using substantially the same recipe or different CMP stations using substantially the same recipe, as described above. ECMP of the layers 103a and 103b can be performed in an individual ECMP process station, or, alternatively, in an ECMD station using an electropolishing solution and cathodically polarizing the layers 103a and 103b. It will be understood that the ECD and the ECMP processes could be performed in a single ECMD station in which ECD is performed without application of a pad or belt and ECMP is performed by cathodically polarizing the layers 103a, 103b. The skilled artisan will readily appreciate that ECD, ECMP or ECMD, and CMP stations may be individual process stations or may be a part of an integrated system that may also include cleaning and annealing stations.

Although various preferred embodiments and the best mode have been described in detail above, those skilled in the art will readily appreciate that many modifications of the exemplary embodiment are possible without materially departing from the novel teachings and advantages of this invention.

What is claimed is:

1. A method of forming metal layers having substantially same thicknesses on wafers including features with varying depths, comprising:

forming a first conductive layer on a first wafer including a first top surface and a first feature having a first depth, the first conductive layer filling the first feature and extending over the first top surface;

forming a second conductive layer on a second wafer including a second top surface and a second feature having a second depth which is substantially different than the first depth, the second conductive layer filling the second feature and extending over the second top surface, wherein a thickness of the first layer over the first top surface is substantially the same as a thickness of the second layer over the second top surface, and wherein forming the first and second conductive layers results in a first metallization pattern in the first top surface that is different from a second metallization pattern in the second top surface; and removing the first conductive layer from the first top surface and the second conductive layer from the second top surface using substantially same process conditions.

2. The method of claim 1, wherein the first and second conductive layers are planar.

3. The method of claim 1, wherein the first conductive layer and the second conductive layer are removed in a same chemical mechanical polishing station.

4. The method of claim 2, wherein the first and the second conductive layers are deposited in an electrochemical mechanical deposition station.

5. The method of claim 2, wherein the first conductive layer is deposited in a first electrochemical mechanical deposition station and the second conductive layer is deposited in a second electrochemical mechanical deposition station.

6. The method of claim 1, wherein an electrochemical mechanical deposition process is used to deposit the first conductive layer and the second conductive layer.

7. The method of claim 1, wherein the first conductive layer is deposited by performing an electrochemical deposition followed by an electrochemical mechanical deposition.

8. The method of claim 7, wherein the first conductive layer is deposited in an electrochemical mechanical deposition station.

9. The method of claim 1, wherein the second conductive layer is deposited by performing an electrochemical deposition process followed by an electrochemical mechanical deposition process.

10. The method of claim 9, wherein the second conductive layer is deposited in an electrochemical mechanical deposition station.

11. The method of claim 1, wherein the first and the second conductive layers are copper.

12. The method of claim 1, wherein the first conductive layer forms an interconnect metallization layer of an integrated circuit formed on the first wafer.

13. The method of claim 12, wherein the second conductive layer forms another interconnect metallization layer of another integrated circuit formed on the second wafer.

14. A method of forming planar metal layers having substantially the same thickness on wafers including features with varying depths, comprising:

depositing a first conductive layer on a wafer, the wafer including a first surface and a first feature having a first depth, the first conductive layer filling the first feature and extending over the first surface;

depositing a second conductive layer over a second surface of the wafer and over a second feature having a second depth which is substantially different than the first depth, the second conductive layer filling the second feature and extending over the second surface, wherein the first and second surfaces are on different metallization levels of the wafer, the first and second surfaces having different metallization patterns;

electropolishing the first conductive layer and the second conductive layer to form a first planar layer on the first surface and a second planar layer on the second surface, a thickness of the first planar layer on the first surface being substantially the same as a thickness of the second planar layer on the second surface; and removing the first planar layer and the second planar layer using substantially the same process conditions.

15. The method of claim 14, wherein the first planar layer and the second planar layer are removed in a chemical mechanical polishing station.

16. The method of claim 14, wherein the first planar layer and the second planar layer are removed in similarly configured chemical mechanical polishing stations.

17. The method of claim 14, wherein the first and the second conductive planar layers are deposited in an electrochemical deposition station.

18. The method of claim 14, wherein the first conductive layer is deposited in a first electrochemical deposition station and the second conductive layer is deposited in a second electrochemical deposition station.

19. The method of claim 14, wherein an electrochemical mechanical deposition process is used to deposit the first conductive layer and the second conductive layer.

20. The method of claim 14, wherein the first and the second conductive planar layers are copper.

21. The method of claim 14, wherein a variation between the thickness of the first planar layer and the thickness of the second planar layer is less than 0.2 μm.

* * * * *